(12) United States Patent
Mamezaki et al.

(10) Patent No.: US 10,517,178 B2
(45) Date of Patent: Dec. 24, 2019

(54) VIA FILL SUBSTRATE, PRODUCTION METHOD THEREFOR, AND PRECURSOR THEREFOR

(71) Applicant: Mitsuboshi Belting Ltd., Kobe-shi, Hyogo (JP)

(72) Inventors: Osamu Mamezaki, Hyogo (JP); Yoko Hayashi, Hyogo (JP)

(73) Assignee: Mitsuboshi Belting Ltd., Kobe-shi, Hyogo (JP)

( * ) Notice: Subject to any disclaimer, the term of this patent is extended or adjusted under 35 U.S.C. 154(b) by 0 days.

(21) Appl. No.: 15/761,288

(22) PCT Filed: Sep. 21, 2016

(86) PCT No.: PCT/JP2016/077805
§ 371 (c)(1),
(2) Date: Mar. 19, 2018

(87) PCT Pub. No.: WO2017/051816
PCT Pub. Date: Mar. 30, 2017

(65) Prior Publication Data
US 2018/0249581 A1 Aug. 30, 2018

(30) Foreign Application Priority Data

Sep. 24, 2015 (JP) ................. 2015-187367

(51) Int. Cl.
*H05K 3/00* (2006.01)
*H05K 1/11* (2006.01)
(Continued)

(52) U.S. Cl.
CPC ............ *H05K 3/0094* (2013.01); *H01B 1/02* (2013.01); *H05K 1/0306* (2013.01); *H05K 1/11* (2013.01);
(Continued)

(58) Field of Classification Search
CPC ...... H05K 3/0094; H05K 1/0306; H05K 1/11; H05K 3/40; H05K 1/092; H01B 1/02
(Continued)

(56) References Cited

U.S. PATENT DOCUMENTS

2004/0201096 A1    10/2004   Iijima et al.
2005/0085084 A1*    4/2005   Chang ............... H01L 21/02063
                                                          438/706
(Continued)

FOREIGN PATENT DOCUMENTS

JP    H05308182 A    11/1993
JP    2004-327508 A  11/2004
(Continued)

OTHER PUBLICATIONS

Hirose et al. (Japanese Patent Publication No. 2004-327508), Nov. 18, 2004.*

(Continued)

*Primary Examiner* — Tremesha S Willis
(74) *Attorney, Agent, or Firm* — Banner & Witcoff, Ltd.

(57) ABSTRACT

A method for producing a via-filled substrate includes a metal film forming step of forming a metal film containing an active metal on a hole part wall surface of an insulating substrate having a hole part, a filling step of filling a conductor paste having a volume change rate before and after firing of −10 to 20% in the hole part in which the metal film is formed, and a firing step of firing the insulating substrate in which the conductor paste is filled.

10 Claims, 2 Drawing Sheets

(51) Int. Cl.
*H05K 3/40* (2006.01)
*H01B 1/02* (2006.01)
*H05K 1/03* (2006.01)
*H05K 1/09* (2006.01)

(52) U.S. Cl.
CPC ............... *H05K 3/40* (2013.01); *H05K 1/092* (2013.01); *H05K 2201/0183* (2013.01)

(58) Field of Classification Search
USPC ........................................................ 174/262
See application file for complete search history.

(56) References Cited

U.S. PATENT DOCUMENTS

2009/0104738 A1* 4/2009 Ring ................. H01L 21/76898
 438/172
2010/0000768 A1* 1/2010 Maeda .................... H01L 23/10
 174/255
2010/0242270 A1 9/2010 Iijima et al.

FOREIGN PATENT DOCUMENTS

| JP | 2006-203112 A | 8/2006 |
| JP | 2009-059744 A | 3/2009 |
| JP | 2010-108917 A | 5/2010 |
| JP | 2011-077177 A | 4/2011 |
| TW | I333687 B | 11/2010 |

OTHER PUBLICATIONS

Hayashi et al. (Japanese Patent Publication No. 2011-077177), Apr. 14, 2011.*
Dec. 13, 2016—International Search Report—International Application No. PCT/JP2016/077805.
Aug. 11, 2017—(TW) Office Action—App 105130883.
Jun. 5, 2018—(JP) Notification of Reasons for Refusal—App 2015-187367.
Dec. 28, 2018—(JP) Decision of Refusal—App 2015-187367 (dated Jan. 8, 2019)—Eng Tran.
Jun. 19, 2019—(KR) Office Action—App 10-2018-7007947—Eng Tran.
Sep. 3, 2019—(CN) Office Action—App 201680055559.1—Eng Tran.

* cited by examiner

| | |
|---|---|
| Forming a hole part in an insulating substrate |  |
| Forming a metal film containing an active metal on a hole part wall surface by sputtering or the like |  |
| Annealing |  |
| Filling the hole part with a conductor paste |  |
| Firing |  |

# VIA FILL SUBSTRATE, PRODUCTION METHOD THEREFOR, AND PRECURSOR THEREFOR

CROSS REFERENCE TO RELATED APPLICATIONS

This is a U.S. National Phase Application under 35 U.S.C. § 371 of International Application No. PCT/JP2016/077805, filed Sep. 21, 2016, which claims priority to Japanese Application No. 2015-187367 filed Sep. 24, 2015, which was published Under PCT Article 21(2), the entire disclosures of which are incorporated herein by reference.

TECHNICAL FIELD

The present invention relates to a front and back conductive substrate (via-filled substrate), a method for producing the same, and a precursor thereof.

BACKGROUND ART

Electronic substrates have hitherto been used for arrangement of functional parts or formation of wiring circuits. In recent years, for miniaturization, high functionalization and integration of electronic devices or parts, there have been increased uses for forming through holes (vias) in an insulating substrate and providing a conductive material in the through holes, thereby electrically conducting both surfaces of the substrate. As methods for electrically conducting both surfaces of the substrate, Patent Document 1 discloses a method of forming an Au plating layer as a metal layer on inner wall parts of through holes of an insulating substrate, and Patent Document 2 discloses a method of completely filling approximately drum-shaped through holes formed in predetermined positions of an insulating substrate with a plating metal.

However, these methods require a plating process having large environmental load, and therefore, are complicated in process and also have low economical efficiency.

There is also known a method, as illustrated in FIG. 1, of filling through holes with a conductor paste (conductive paste) composed of a metal powder and a curable resin, followed by curing to obtain filled vias. However, electrical conductivity is low, because the resin is contained in a conductive material, and heat resistance of a substrate is also low, because of restriction due to the heat resistance of the resin.

Furthermore, there is also known a method of filling through holes with a conductor paste composed of a metal powder, an inorganic binder and a resin, and sintering the metal powder by heating at a sintering temperature of the metal or higher to obtain conductive filled vias. This method is excellent in simplicity, and also provides high electrical conductivity, thermal conductivity and heat resistance, because the resin component is evaporated and decomposed by firing. However, in a via-filled substrate obtained by firing after filling the vias with the conductor paste, gaps or voids are sometimes present between the filled conductor (conductive via part) and a wall surface of the hole part. It can be presumed that a cause for occurrence of these gaps or voids is partially because of contraction of the conductor paste filled in the hole due to solvent removal (drying) or due to sintering the metal powder during high-temperature firing.

When the gaps are present between the filled conductor and the wall surface, at least the following three problems may be caused.

(1) When a conductive film (such as an electrode or wiring) is formed on the substrate surface across the filling part, the conductive film may be cut by the presence of the gaps to cause deterioration of conductive performance or disconnection.

(2) The gaps present on the wall surface may be connected to one another along the wall surface to make it impossible to secure impermeability such as airtightness or solder barrier properties of the filling part (for example, uses requiring the airtightness or solder barrier properties).

(3) When the via-filled substrate passes through a wet process such as welding, as a post process, a chemical or the like may intrude into the gaps to cause failures such as a burst of the via part, swelling of a surface film and discoloration.

In the method using the conductor paste, conductor pastes which can suppress sintering contraction during firing have been proposed. Patent Document 3 discloses a Cu conductor paste comprising a Cu powder, a glass powder and an organic vehicle, and having a volume change rate due to firing of 8% or less, and Patent Document 4 discloses a conductor paste comprising Ag as a main component, conductive metal particles containing a metal powder and metal nanoparticles, a glass and/or an inorganic oxide, and an organic vehicle, and having a volume change rate after firing at 600° C. of ranging from −5 to +10%. When these conductor pastes are used, surface smoothness can be improved, and further, adhesion force between the filling part and the substrate can also be improved.

However, even when these conductor pastes are used, it is difficult to completely eliminate the occurrence of gaps or voids. That is, the above-mentioned problems (1) to (3) cannot be completely solved. The cause for the occurrence of these gaps or voids is because a high conductive metal such as Cu or Ag is low in wettability with a ceramic substrate, by its nature, and cannot wet the ceramic substrate (hole part wall surface) under firing conditions, and therefore, even when the conductor paste having small sintering contraction during firing is used, it is difficult to form a continuous bonding interface layer between the sintered metal and the substrate wall surface. In other words, gaps or voids are liable to occur between the conductor (conductive via part) filled after sintering and the hole part wall surface. In each of the conductor pastes disclosed in Patent Document 3 and Patent Document 4, the glass component blended in the paste is present in the interface between the filled conductor (conductive via part) and the hole part wall surface by melt flow during firing and forms a bonding layer, thereby exhibiting the adhesion force and filling a part of gaps or voids. However, it is difficult to fill up all of gaps or voids, because the ratio of the glass component is limited. Such gaps or voids present along the wall surface are easily connected to one another, leading to impairing the airtightness or non-permeability (a characteristic of preventing a liquid from intruding).

In each of these conductor pastes, the glass component is essential. Therefore, denseness, electrical conductivity and heat radiation cannot be highly improved.

Furthermore, Patent Document 5 discloses a method of forming an oxide layer of an active metal on an inside wall surface of a via, and further forming a conductor layer composed of the above-mentioned active metal inside this oxide layer, thereby improving adhesive force and adhesion force between the inside via conductor and the via wall surface.

However, even when this method is used, it is difficult to highly suppress the occurrence of gaps between the conductive via part and the hole part wall surface. That is, when the sintering contraction of the conductor paste for forming the conductive via part is large, contraction stress exceeds the adhesion force between the conductive via part (conductive via part including the conductor layer) and the via wall surface, and the conductive via part (conductive via part including the conductor layer) is peeled from the via wall surface to form gaps. As a result, the airtightness or the non-permeability of the via-filled substrate is impaired. Patent Document 5 does not disclose the details of the conductor paste for forming the conductive via part, and the airtightness or the non-permeability of the via-filled substrate is not verified.

PRIOR ART DOCUMENTS

Patent Documents

Patent Document 1: JP-A-5-308182
Patent Document 2: JP-A-2006-203112
Patent Document 3: JP-A-2010-108917
Patent Document 4: JP-A-2011-77177
Patent Document 5: JP-A-2009-59744

SUMMARY OF THE INVENTION

Problems that the Invention is to Solve

Accordingly, an object of the present invention is to provide a via-filled substrate which can suppress the occurrence of voids or gaps, a method for producing the same, and a precursor thereof.

Another object of the present invention is to provide a via-filled substrate having excellent airtightness (gas barrier properties), non-permeability, conductivity, heat resistance, heat radiation and reliability and applicable to a wet process such as plating, a method for producing the same, and a precursor thereof.

BRIEF DESCRIPTION OF THE DRAWINGS

The present disclosure is illustrated by way of example and not limited in the accompanying figures in which.

MEANS FOR SOLVING THE PROBLEMS

In order to achieve the above-mentioned objects, the present inventors have made intensive studies. As a result, it has been found that the occurrence of voids or gaps in the via-filled substrate can be suppressed by forming a metal film containing an active metal on a hole part wall surface of an insulating substrate having a hole part, and thereafter, filling a conductor paste having a volume change rate before and after firing of −10 to 20% in the hole part in which the metal film is formed, followed by firing. Thus, the present invention has been completed.

Figure 1:
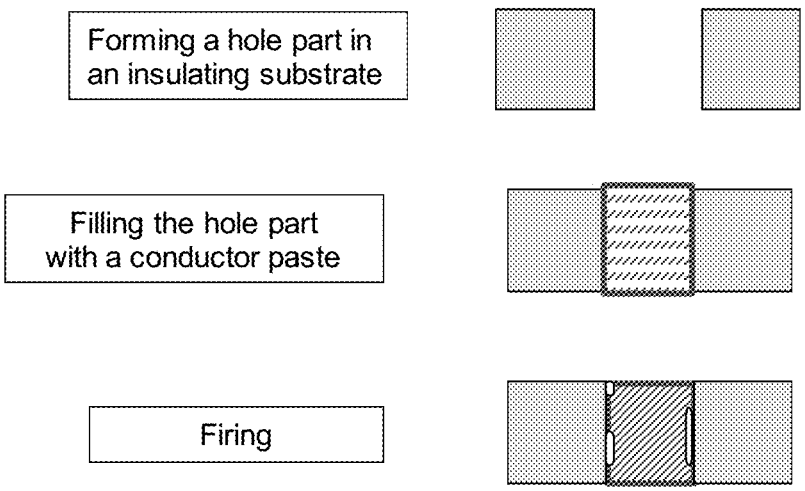
FIG. 1 is an illustration of a method of forming and filling a via hole without a metal film on the hole part wall surface according to the prior art.
Figure 2:
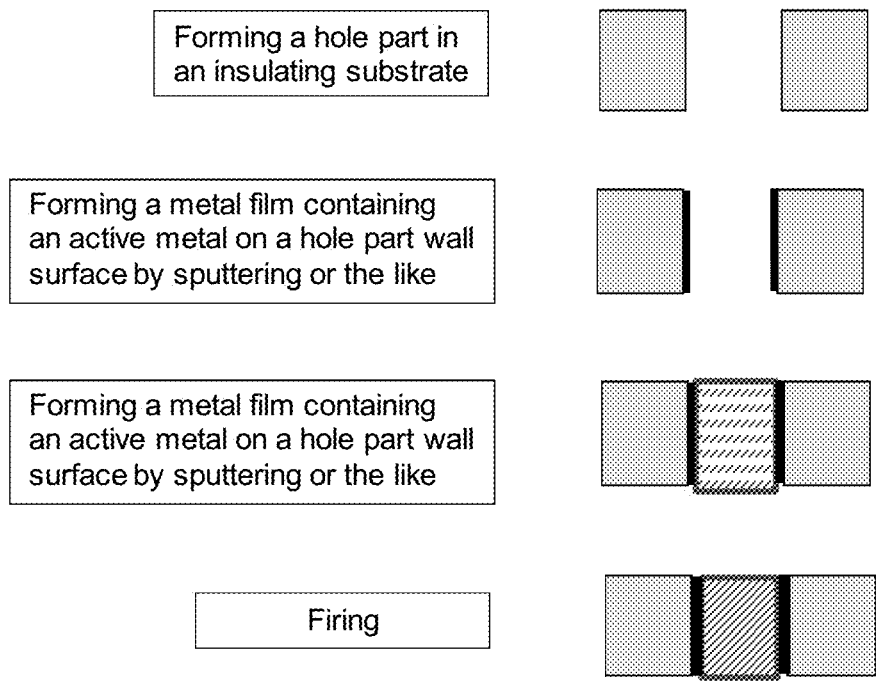
FIG. 2 is an illustration of a method of forming and filling a via hole with a metal film containing an active metal on a hole part wall surface in accordance with one embodiment of the invention.
Figure 3:
FIG. 3 is an illustration of a method of forming and filling a via hole with a metal film containing an active metal on a hole part wall surface and annealing in accordance with another embodiment of the invention.
Figure 3:
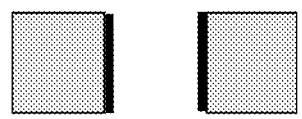
Figure 3:
Figure 3:
Figure 3:

With reference to FIGS. 2 and 3, the method for producing a via-filled substrate of the present invention includes a metal film forming step of forming a metal film containing an active metal on a hole part wall surface of an insulating substrate having a hole part, a filling step of filling a conductor paste having a volume change rate before and after firing of −10 to 20% in the hole part in which the metal film is formed, and a firing step of firing the insulating substrate in which the conductor paste is filled. In the metal film forming step, an active metal layer containing at least one active metal selected from the group consisting of Ti, Zr, Nb, Ta, Cr, Mn and Al or an alloy containing the active metal may be formed on the hole part wall surface. In the metal film forming step, a non-permeable layer containing at least one metal selected from the group consisting of Mo, W, Ni, Pd and Pt or an alloy containing the metal may be further formed on the active metal layer. In the metal film forming step, a bonding layer containing a metal that is the same as or capable of being alloyed with a metal contained in the conductor paste may be formed on an uppermost surface in contact with the conductor paste. In the metal film forming step, the metal film may be formed by a physical vapor deposition method. As illustrated in FIG. 3, the production method may further include an annealing step of heating the metal film in an inert gas atmosphere at a temperature of 400° C. or more and equal to or less than a melting point of a metal having the lowest melting point among all metal species constituting the metal film or a melting point of an alloy constituting the metal film, whichever is lower, as a preceding step of the filling step. The conductor paste may contain a metal particle and an organic vehicle. The metal particle may contain a small metal particle having a particle size of less than 1 μm and a large metal particle having a particle size of 1 to 50 μm. A ratio of the organic vehicle may be 40% by volume or less based on a whole paste. The metal particle may be at least one metal selected from the group consisting of Cu, Ag, Ni, Au, Pt and Al or an alloy containing the metal. The small metal particle may contain a metal nanoparticle having a particle size of 100 nm or less. The conductor paste preferably contains no glass component. The insulating substrate may be a ceramic substrate, a glass substrate, a silicon substrate or an enamel substrate.

The present invention further includes a via-filled substrate precursor including an insulating substrate having a hole part, a metal film containing an active metal formed on a hole part wall surface, and a conductor paste filled in the hole part in which the metal film is formed and having a volume change rate before and after firing of −10 to 20%.

The present invention further includes a via-filled substrate including an insulating substrate having a hole part, a metal film containing an active metal formed on a hole part wall surface, and a conductive via part formed of a conductor filled in the hole part in which the metal film is formed, wherein the metal film contains an active metal layer and a non-permeable layer and/or a bonding layer, the active metal layer is formed on the hole part wall surface of the insulating substrate and contains at least one active metal selected from the group consisting of Ti, Zr, Nb, Ta, Cr. Mn and Al or an alloy containing the active metal, the non-permeable layer is formed on the active metal layer and contains at least one metal selected from the group consisting of Mo, W, Ni, Pd and Pt or an alloy containing the metal, and the bonding layer is formed on an uppermost surface in contact with the conductive via part and contains a metal that is the same as or capable of being alloyed with a metal contained in the conductive via part. In the via-filled substrate a of the present invention, the insulating substrate may contain a metal oxide, and the active metal layer has a layer formed of an oxide of the active metal on a hole part wall surface side.

Advantage of the Invention

In the present invention, a metal film containing an active metal is formed on a hole part wall surface of an insulating substrate having a hole part, and thereafter, a conductor paste having a volume change rate before and after firing of −10 to 20% is filled in the hole part in which the metal film is formed, followed by firing. Therefore, the occurrence of voids or gaps can be suppressed. For this reason, a via-filled substrate obtained has excellent airtightness (gas barrier properties), non-permeability, conductivity, heat resistance, heat radiation and reliability, and is also applicable to a wet process such as plating.

MODE FOR CARRYING OUT THE INVENTION

[Production Method of Via-Filled Substrate]

A production method of a via-filled substrate of the present invention includes a metal film forming step of forming a metal film containing an active metal on a hole part wall surface (a wall surface or an inner wall surface constituting a hole part) of an insulating substrate having a hole part, a filling step of filling a conductor paste having a volume change rate before and after firing of −10 to 20% in the hole part in which the metal film is formed, and a firing step of firing the insulating substrate in which the conductor paste is filled.

(Metal Film Forming Step)

In the metal film forming step, a metal layer containing the active metal is formed as the metal film on the hole part wall surface, and usually, an active metal layer is formed on a hole wall surface. In the present invention, by forming the metal layer containing the active metal on the hole part wall surface, the conductor paste filled in the hole part is significantly improved in wettability to the hole part wall surface to be able to largely decrease the occurrence of voids or gaps and also to improve adhesion between a conductive via part and the insulating substrate, thus attaining firmer via filling.

The active metal may be any metal which reacts with a constituent of the insulating substrate or any metal which can form a compound with the above-mentioned constituent, and examples thereof include Ti, Zr, Nb, Ta, Cr, Mn, Al and the like. These active metals may be used either alone or as a combination of two or more thereof, and may be an alloy in which two or more thereof are combined.

Of these active metals, active metals including Ti, Zr or Cr are preferred. Usually, these active metals are widely used as simple substances.

Further, the active metal may be an alloy with a barrier metal (particularly, Mo or W) constituting a non-permeable layer described later, because the occurrence of voids or gaps can be suppressed without deteriorating electric characteristics of the conductive via part, even in the case of a simple film structure. In the alloy of the active metal and the barrier metal, a ratio of the barrier metal is 200 parts by mass or less based on 100 parts by mass of the active metal, for example, from 1 to 150 parts by mass, preferably from 5 to 150 parts by mass, and more preferably from 10 to 100 parts by mass or so. When the ratio of the barrier metal is too large, the adhesion between the hole part wall surface of the insulating substrate and the metal film may be deteriorated.

The active metal layer may contain any active metal, and for example, may contain an active metal compound. It is usually an active metal simple substance, an alloy of the active metals or an alloy of the active metal and the barrier metal. The active metal compound is preferably a compound (for example, $TiH_2$, $ZrH_2$ or the like) easily producing the active metal by heating.

An average thickness of the active metal layer is, for example, 0.005 μm or more, for example, from 0.005 to 1.0 μm, preferably from 0.01 to 0.5 μm, and more preferably from 0.05 to 0.3 μm (particularly, from 0.08 to 0.2 μm) or so. When the thickness of the active metal layer is too thin, adhesion force with the substrate is not sufficiently obtained, and the metal film may be peeled from the hole part wall surface to cause the occurrence of voids or gaps. On the other hand, when the thickness of the active metal layer is too thick, conductivity of the filled part may be impaired, and this case is disadvantageous in cost.

In the metal layer forming step, it is preferred to further form a non-permeable layer (barrier layer) containing a barrier metal on the above-mentioned active metal layer. In the present invention, by laminating the non-permeable layer on the above-mentioned active metal layer, the non-permeable layer prevents, as the barrier layer, mutual diffusion during firing of the active metal and the conductive metal filled in the hole part, deterioration of the electrical characteristics due to diffusion of the active metal to the inside of the conductive via part and deterioration of the adhesion due to diffusion of the conductive metal to the active metal layer and alloying can be suppressed, and peeling of the active metal layer from the hole part wall surface due to the diffusion and the alloying can be more surely prevented.

The barrier metal is not particularly limited as long as the metal has the above-mentioned barrier properties, and examples thereof include Mo, W, Ni, Pd, Pt and the like. These barrier metals may be used either alone or as a combination of two or more thereof, and may be an alloy in which two or more thereof are combined.

Of these barrier metals, Pd and Pt are preferred. Usually, these barrier metals are widely used as simple substances.

The non-permeable layer may contain any barrier metal, and for example, may contain a barrier metal compound. It is usually a barrier metal simple substance or an alloy of the barrier metals.

An average thickness of the non-permeable layer is, for example, 0.01 μm or more, for example, from 0.01 to 0.5 μm, preferably from 0.05 to 0.3 μm, and more preferably from 0.1 to 0.2 μm or so. When the thickness of the non-permeable layer is too thin, the effect of the active metal layer may be deteriorated, or the adhesion between the conductive via part and the hole part may be deteriorated. When the thickness of the active metal layer is too thick, it is disadvantageous in cost.

In the metal film forming step, it is preferred to form a bonding layer containing a metal which is the same as or capable of being alloyed with the metal contained in the conductor paste, on an uppermost surface in contact with the conductor paste. The bonding layer may be laminated, for example, on the active metal layer, or may be formed on the non-permeable layer. When the metal of the non-permeable layer is a metal having properties of the bonding layer, the non-permeable layer can act as the bonding layer. In the present invention, by laminating the bonding layer on the uppermost surface, the conductor paste filled in the hole part of the insulating substrate and the metal layer can be bonded more surely with high adhesion to each other without forming voids.

The metal for forming the bonding layer may be a metal different from the metal for forming a layer (non-permeable layer or active metal layer) in contact with the bonding layer and a metal (bonding metal) which is the same as or capable of being alloyed with the metal contained in the conductor paste, and examples thereof include Pd, Pt, Au, Ag, Cu, Ni, Al and the like. These bonding metals may be used either alone or as a combination of two or more thereof, and may be an alloy in which two or more thereof are combined.

Of these bonding metals, the same metal as the metal contained in the conductor paste is preferred. The preferred bonding metals may be metals including, for example, Au, Ag, Cu, Ni and Al. Usually, these metals are widely used as simple substances. These bonding metals are high conductive metals commonly used as filling conductors, and particularly, when the metals are the same as the metal contained in the conductor paste, the wettability and the adhesion can be improved. Therefore, denser and firmer adhesion to the insulating substrate can be attained.

The bonding layer is may contain any bonding metal, and for example, the layer may contain a bonding metal compound. The bonding metal is usually a bonding metal simple substance or an alloy of the bonding metals.

An average thickness of the bonding layer is, for example, 0.01 µm or more, for example, from 0.01 to 0.5 µm, preferably from 0.05 to 0.2 µm, and more preferably from 0.08 to 0.15 µm or so. When the thickness of the bonding layer is too thin, the effect of forming the bonding layer may be deteriorated.

An average thickness of the total metal film is, for example, 0.05 µm or more, for example, from 0.05 to 2 µm, preferably from 0.1 to 1 µm, and more preferably from 0.15 to 0.5 µm (particularly, from 0.2 to 0.4 µm) or so.

As a method for forming these metal films, a physical vapor deposition method (PVD method), a chemical vapor deposition method (CVD method) or the like may be used. Because the metal film can be easily formed, the physical vapor deposition method is preferred. Examples of the physical vapor deposition methods include, for example, a vacuum vapor deposition method, a flush vapor deposition method, an electron beam vapor deposition method, an ion beam vapor deposition method, a sputtering method, an ion plating method, a molecular beam epitaxy method, a laser ablation method and the like. Of these, the sputtering method and the ion plating method are preferred, and the sputtering method is particularly preferred, because physical energy is high and the adhesion force between the metal film formed and the insulating substrate can be improved. The sputtering method can be used under conventional conditions.

A material constituting the insulating substrate in which such a metal film is formed in the hole part requires heat resistance because it passes through the firing step. The material is usually an inorganic material (inorganic raw material) although it may be an organic material such as an engineering plastic.

Examples of the inorganic materials include, ceramics {metal oxides (such as quartz, alumina or aluminum oxide, zirconia, sapphire, ferrite, titania or titanium oxide, zinc oxide, niobium oxide, mullite and beryllia), silicon oxides (such as silicon dioxide), metal nitrides (such as aluminum nitride and titanium nitride), silicon nitride, boron nitride, carbon nitride, metal carbides (titanium carbide and tungsten carbide), silicon carbide, boron carbide, metal borides (such as titanium boride and zirconium boride) and metal multiple oxides [such as metal titanates (such as barium titanate, strontium titanate, lead titanate, niobium titanate, calcium titanate and magnesium titanate) and metal zirconates (such as barium zirconate, calcium zirconate and lead zirconate)]}, glasses (such as soda glass, borosilicate glass, crown glass, barium-containing glass, strontium-containing glass, boron-containing glass, low alkali glass, non-alkali glass, crystallized transparent glass, silica glass, quartz glass and heat-resistant glass), silicons (such as semiconductor silicon) and the like. The inorganic material may be a composite material (for example, enamel or the like) of the inorganic material and a metal.

The insulating substrate may be, for example, a heat-resistant substrate such as a ceramic substrate, a glass substrate, a silicon substrate or an enamel substrate. Of these heat-resistant substrates, the ceramic substrate such as an alumina substrate, an aluminum nitride substrate or a silicon nitride substrate is preferred.

The hole part wall surface of the insulating substrate may be subjected to surface treatment such as oxidation treatment [surface oxidation treatment, for example, discharge treatment (such as corona discharge treatment or glow discharge), acid treatment (such as chromic acid treatment), ultraviolet irradiation treatment, flame treatment or the like] or surface roughening treatment (such as solvent treatment or sand blast treatment).

An average thickness of the insulating substrate may be appropriately selected according to the use, and may be, for example, from 0.01 to 10 mm, preferably from 0.05 to 5 mm, and more preferably from 0.1 to 1 mm (particularly, from 0.2 to 0.8 mm) or so.

In the insulating substrate, the hole part (usually, a plurality of the hole parts) for filling the conductive via part is formed, and usually this hole part is through holes. The holes may be non-through holes. A cross-sectional shape parallel to a substrate surface direction of the hole part is not particularly limited, and may be a polygon (such as a triangle, a quadrangle or a hexagon). The shape is usually a circle or an ellipse, and preferably a circle.

An average hole diameter of the hole part is, for example, from 0.05 to 10 mm, preferably from 0.08 to 5 mm, and more preferably from 0.1 to 1 mm or so.

A forming method of the hole part is not particularly limited, and a known method such as a laser method, a blast method, an ultrasonic method, a grinding method or a drill method may be appropriately used.

(Annealing Step)

The insulating substrate in which the metal film is formed on the hole part wall surface may be subjected to an annealing step of heating the metal film in an inert gas atmosphere as a preceding step of the filling step. In the production method of the present invention, the annealing step is not an essential step. However, depending on the kind of the metal film, when the above-mentioned insulating substrate is subjected to the filling step and the firing step described later without passing through the annealing step, and fired at high temperature, the metal of the conductor paste and the metal film are alloyed during firing, and the metal film is incorporated into the conductive via part to disappear, whereby the adhesion force between the conductive via part and the insulating substrate may be deteriorated or voids may occur in a bonding part. On the other hand, when subjected to the annealing step, the active metal of the metal film reacts with the hole part wall surface of the insulating substrate preferentially to alloying with the metal of the conductor paste to form the firm metal film on the hole part wall surface, thereby improving the adhesion force and also causing alloying with a different metal in the metal film. As a result, the alloying of the metal component of the metal film and the metal of the conductor paste during the conductor paste firing can be suppressed, thereby improving the adhesion force and more surely preventing the formation of voids in the interface part.

A heating temperature in the annealing step may be 400° C. or more and equal to or less than a melting point of the metal having the lowest melting point among all metal species constituting the metal film or a melting point of the alloy constituting the metal film, whichever is lower, and may be selected according to the metal species. The specific heating temperature is, for example, from 400 to 1500° C., preferably from 500 to 1200° C., and more preferably from 600 to 1100° C. (particularly, from 700 to 1000° C.) or so. When the heating temperature is too low, the effect of improving the adhesion force between the metal film and the hole part wall surface may be reduced, and when too high, the metal component may be melted and transferred to deteriorate uniformity of the metal film, or the wall surface base material may be partially exposed.

A heating time may be, for example, 1 minute or more, for example, from 1 minute to 1 hour, preferably from 3 to 30 minutes, and more preferably from 5 to 20 minutes or so. When the heating time is too short, the effect of improving the adhesion force between the metal film and the hole part wall surface may be reduced.

The annealing step may be performed under an active gas atmosphere. However, because the active metal is not oxidized and efficiently forms the metal film to make it possible to improve the adhesion to the conductive via part, it is preferably performed in vacuum or in the inert gas (for example, nitrogen gas, argon gas, helium gas or the like) atmosphere.

(Filling Step)

In the filling step, the conductor paste (metal paste or conductive paste) may contain a metal particle. A metal constituting the metal particles is not particularly limited as long as the metal has the conductivity, and examples thereof include Cu, Ag, Ni, Au, Pt, Al and the like. These metals may be used either alone or as a combination of two or more thereof, and may be an alloy in which two or more thereof are combined. Of these, Cu or Ag is preferred in terms of the conductivity, reliability and economical efficiency.

An average particle size (central particle size) of the metal particle is approximately 100 μm or less (particularly, 50 μm or less), for example, from 0.001 to 50 μm, preferably from 0.01 to 20 μm, and more preferably from 0.1 to 10 μm or so. When the average particle size is too large, dense filling in the hole part may become difficult.

The metal particle preferably contains a small metal particle having a particle size of less than 1 μm (for example, 1 nm or more and less than 1 μm) and a large metal particle having a particle size of 1 to 50 μm, because the metal content in the paste can be improved and the denseness and conductivity of the conductive via part can be improved.

An average particle size (central particle size) of the small metal particle may be selected from a range of approximately 0.01 to 0.9 μm (particularly, 0.1 to 0.8 μm). In particular, when the small metal particle is a Cu particle, the average particle size of the small metal particle is, for example, from 0.1 to 0.95 μm, preferably from 0.3 to 0.9 μm, and more preferably from 0.4 to 0.85 μm or so. When the small metal particle is an Ag particle, the average particle size of the small metal particle is, for example, from 0.1 to 0.8 μm, preferably from 0.1 to 0.5 μm, and more preferably from 0.1 to 0.3 μm or so. When the average particle size of the small metal particles is too small, the viscosity of the conductor paste may be increased to make handling difficult, and when too large, the effect of improving the denseness may be reduced.

The small metal particle preferably contain a metal nanoparticle having a particle size of 100 nm or less, because the metal content in the paste can be more improved and the conductive via part having higher denseness can be formed. An average particle size (central particle size) of the metal nanoparticle is, for example, from 5 to 80 nm, preferably from 10 to 60 nm, and more preferably from 15 to 45 nm (particularly, from 20 to 40 nm) or so. When the average particle size of the metal nanoparticles is too small, handleability may become difficult, and when too large, the effect of improving the denseness of the conductive via part may be reduced.

The metal nanoparticle may be a metal colloidal particle containing a protective colloid (a carboxylic acid such as acetic acid or a polymer dispersing agent). As the metal colloidal particles, for example, metal colloidal particles described in JP-A-2010-202943, JP-A-2010-229544, JP-A-2011-77177, JP-A-2011-93297, JP-A-2011-94233 and the like may be used.

A ratio of the metal nanoparticle may be from 0 to 906% by mass based on the whole small metal particle, and it is, for example, from 5 to 90% by mass, preferably from 10 to 80% by mass, and more preferably from 20 to 70% by mass (particularly, from 30 to 60% by mass) or so. When the ratio of the metal nanoparticle is too high, organic matter such as the protective colloid incidentally contained may also be increased to increase sintering contraction of the conductor paste.

An average particle size (central particle size) of the large metal particles may be selected from a range of approximately 1.5 to 30 μm (particularly, 2 to 10 μm). In particular, when the large metal particle is a Cu particle, the average particle size of the large metal particle is, for example, from 2 to 30 μm, preferably from 3 to 20 μm, and more preferably from 5 to 10 μm or so. When the large metal particle is an Ag particle, the average particle size of the large metal particle is, for example, from 1.2 to 20 μm, preferably from 1.5 to 10 μm, and more preferably from 2 to 5 μm or so. When the average particle size of the large metal particles is too small, the sintering contraction of the conductor paste may be increased, and when too large, filling properties of the conductive via part may be deteriorated.

A compounding ratio of the small metal particle and the large metal particle, the small metal particle/the large metal particle, may be selected from a range of approximately from 10/90 to 50/50 by volume ratio, and it is, for example, from 15/85 to 45/55, preferably from 20/80 to 40/60, and more preferably from 25/75 to 35/65 or so. When the small metal particle contains the metal nanoparticle, the compounding ratio of both, the small metal particle/the large metal particle, is, for example, from 20/80 to 70/30, preferably from 30/70 to 60/40, and more preferably from 40/60 to 60/40 or so, by volume ratio. When a material of the metal particle used in the conductor paste is one kind, the metal particle may be blended based on mass, because the volume ratio is the same as the mass ratio. When two or more kinds of the metal particles different in specific gravity are used, the metal particles may be blended by converting each compounding volume into mass.

As a method for measuring the particle size of the metal particles, the particle size may be measured with a laser diffraction scattering type particle size distribution measuring device or a transmission type electron microscope (TEM), and for details, it can be measured by a method described in Examples described later.

The conductor paste may further contain an organic vehicle. An organic binder, a dispersion medium (organic solvent) or the like is contained in the organic vehicle. The protective colloid (such as the carboxylic acid or the polymer dispersing agent) contained in the metal colloidal particles described above is also contained in the organic vehicle. The organic vehicle may be a combination of the organic binder and the dispersion medium.

Examples of the organic binders include thermoplastic resins (such as olefinic resins, vinyl resins, acrylic resins, styrenic resins, polyether resins, polyester resins, polyamide resins and cellulose derivatives), thermosetting resins (such as thermosetting acrylic resins, epoxy resins, phenol resins, unsaturated polyester resins and polyurethane resins) and the like. These organic binders may be used either alone or as a combination of two or more thereof. Of these organic binders, the acrylic resins (such as polymethyl methacrylate and polybutyl methacrylate), the cellulose derivatives (nitrocellulose, ethyl cellulose, butyl cellulose and cellulose acetate), polyethers (such as polyoxymethylene), polyvinyls (such as polybutadiene and polyisoprene) and the like are widely used, and poly($C_{1-10}$ alkyl (meth)acrylates) such as poly(methyl (meth)acrylate) and poly(butyl (meth)acrylate) are preferred in terms of heat decomposition properties and the like.

Examples of a dispersion media include, for example, aromatic hydrocarbons (such as p-xylene), esters (such as ethyl lactate), ketones (such as isophorone), amides (such as dimethyl formamide), aliphatic alcohols (such as octanol, decanol and diacetone alcohol), cellosolves (such as methyl cellosolve and ethyl cellosolve), cellosolve acetates (such as ethyl cellosolve acetate and butyl cellosolve acetate), carbitols (such as carbitol, methyl carbitol and ethyl carbitol), carbitol acetates (such as ethyl carbitol acetate and butyl carbitol acetate), aliphatic polyhydric alcohols (such as ethylene glycol, diethylene glycol, dipropylene glycol, butanediol, pentanediol, triethylene glycol and glycerol), alicyclic alcohols [for example, cycloalkanols such as cyclohexanol; and terpene alcohols (such as monoterpene alcohols) such as terpineol and dihydroterpineol], aromatic alcohols (such as metacresol), aromatic carboxylic acid esters (such as dibutyl phthalate and dioctyl phthalate), nitrogen-containing heterocyclic compounds (such as dimethylimidazole and dimethylimidazolidinone), and the like. These dispersion media may be used either alone or as a combination of two or more thereof. Of these dispersion media, the aliphatic polyhydric alcohols such as pentanediol and the alicyclic alcohols such as terpineol are preferred in terms of fluidity and the filling properties of the paste.

When the organic binder is combined with the dispersion medium, a ratio of the organic binder is, for example, from 1 to 200 parts by mass, preferably from 5 to 100 parts by mass, and more preferably approximately from 10 to 50 parts by mass, based on 100 parts by mass of the dispersion medium.

A volume ratio of the organic vehicle may be 40% by volume or less (particularly, 36% by volume or less) based on the whole paste, and it is, for example, from 10 to 40% by volume, preferably from 15 to 38% by volume, and more preferably from 20 to 37% by volume (particularly, from 25 to 36% by volume) or so. When the volume ratio of the organic vehicle is too large, the rate of contraction of the conductor paste due to drying or firing after filling is increased, and voids or gaps may occur.

The conductor paste may further contain an inorganic binder. Examples of the inorganic binders include, low-melting glasses such as borosilicate-based glass, zinc borosilicate-based glass, bismuth-based glass and lead-based glass, and the like. These inorganic binders may be used either alone or as a combination of two or more thereof. Of these inorganic binders, the borosilicate-based glass or the zinc borosilicate-based glass is preferred in terms of durability against plating treatment.

A mass ratio of the inorganic binder is 10% by mass or less based on the whole paste, and it is, for example, from 0.1 to 10% by mass, preferably from 0.2 to 5% by mass, and more preferably from 0.3 to 1% by mass or so. In the present invention, even when the inorganic binder is not contained, the adhesion between the conductive via part and the hole part wall surface of the insulating substrate can be improved. It is therefore preferred that the conductor paste contains no inorganic binder (particularly, the glass component), because the conductivity of the conductive via part can be improved. The conductor paste containing the metal particles is usually bonded to the hole part wall surface of the insulating substrate such as the ceramic substrate with the blended glass component. However, in the present invention, the metal film (active metal layer) firmly bonded to the substrate is formed on the hole part wall surface, so that the conductor paste is bonded to the metal film on the wall surface by metallic bond. Therefore, the glass component becomes unnecessary. When the glass component is not contained, the metal content of the via-filled part is increased, and the denseness, the conductivity and the heat radiation can be improved.

The conductor paste has a small volume change rate before and after firing, and the conductor after firing is firmly bonded to the hole part wall surface without gaps. Accordingly, the conductive via part obtained by firing this paste is uniform as a whole, and has high airtightness. The volume change rate before and after firing is, for example, from −10 to 20%, preferably from −5 to 15%, and more preferably from 0 to 10% or so. When the volume change rate is too large in a negative (minus) direction (when it is minus and an absolute value thereof is too large), voids or gaps may be formed by the contraction during firing. On the other hand, when the volume change rate is too large in a positive (plus) direction, large voids are formed after firing, or the denseness of the filled via part is deteriorated, which may cause the deterioration of the barrier properties. In the widely used conductor paste, large volume contraction (the volume change rate is minus) occurs. In contrast, the conductor paste in the present invention has a volume change rate of 10% or less even when contracted, and is characterized in compounding formulation rather acting to be slightly expanded (the volume change rate is plus). As a method for measuring the volume change rate, the volume change rate can be calculated by measuring pattern film thicknesses before and after firing with a stylus type film thickness meter, and for details, it can be measured by a method described in Examples described later.

Examples of a method for filling the conductor paste in the hole parts include, printing methods such as a screen printing method, an inkjet printing method, an intaglio printing method (such as a gravure printing method), an offset printing method, an intaglio offset printing method and a flexographic printing method, direct pressure-filling methods such as a roll pressure-filling method, a squeegee pressure-filling method and a press pressure-filling method, and the like. Of these methods, the screen printing method and the like are preferred.

After filling, natural drying may be performed. However, drying may be performed by heating. A heating temperature may be selected, depending on the kind of dispersion medium, and it is, for example, from 80 to 300° C., preferably from 100 to 250° C., and more preferably from 120 to 200° C. or so. A heating time is, for example, from 1 to 60 minutes, preferably from 5 to 40 minutes, and more preferably from 10 to 30 minutes or so.

The dried conductor paste (particularly, the conductor paste containing the Cu particle) may be subjected to the firing step as it is. However, in order to suppress the heat sintering contraction during firing, heat treatment may be performed before firing. A heat treatment temperature before firing may be 180° C. or higher, for example, from 180 to 500° C., preferably from 190 to 300° C., and more preferably from 200 to 250° C. A heat treatment time is, for example, from 10 minutes to 3 hours, preferably from 30 minutes to 2 hours, and more preferably from 1 to 1.5 hours or so.

(Firing Step)

In the firing step, a firing temperature may be any as long as the temperature is equal to or higher than a sintering temperature of the metal particle in the conductive paste. The firing temperature may be, for example, 500° C. or higher, and it is, for example, from 500 to 1500° C., preferably from 550 to 1200° C., and more preferably from 600 to 1000° C. or so. A firing time is, for example, from 10 minutes to 3 hours, preferably from 20 minutes to 3 hours, and more preferably from 30 minutes to 2 hours or so.

An atmosphere of firing may be selected depending on the kind of metal particles. For noble metal particles such as Ag, it is not particularly limited, and firing may be performed in the air. However, for metal particles such as Cu, it is preferred that firing is usually performed in an atmosphere of an inert gas (such as nitrogen gas, argon gas, helium gas).

[Via-Filled Substrate and Precursor Thereof]

The via-filled substrate of the present invention is obtained by the above-mentioned production method, and is a via-filled substrate in which both surfaces of an insulating substrate are electrically conducted. For details, it includes an insulating substrate having a hole part, a metal film containing an active metal formed on a wall surface of the above-mentioned hole part, and a conductive via part formed of a conductor filled in the above-mentioned hole part in which the metal film is formed. The above-mentioned metal film may be any as long as the metal film contains an active metal layer. However, it is preferred to contain the active metal layer, and a non-permeable layer and/or a bonding layer.

The above-mentioned active metal layer contains at least one active metal selected from the group consisting of Ti, Zr, Nb, Ta, Cr, Mn and Al or an alloy containing the active metal, and it is usually formed by each of simple substances of these active metals or the alloy. The active metal layer may have a layer formed of an oxide of the active metal on the hole part wall surface side. For example, when the insulating substrate is formed by the metal oxide, it may be an active metal oxide layer formed on the side of the hole part wall surface of the active metal layer by firing.

The above-mentioned non-permeable layer contains at least one metal selected from the group consisting of Mo, W, Ni, Pd and Pt or an alloy containing the metal, and it is usually formed by each of simple substances of these active metals or the alloy.

The above-mentioned bonding layer contains a metal which is the same as or capable of being alloyed with the metal contained in the conductor paste, and is usually formed by such a metal simple substance.

The via-filled substrate precursor of the present invention is an intermediate before the firing step, and specifically includes an insulating substrate having a hole part, a metal film containing an active metal formed on a wall surface of the above-mentioned hole part, and a conductor paste filled in the above-mentioned hole part in which the metal film is formed and having a volume change rate before and after firing of −10 to 20%.

EXAMPLES

The present invention is described in more detail below with reference to Examples. However, the present invention should not be construed as being limited to these Examples. In the following Examples, measurement methods of evaluation tests and preparation methods of conductor pastes are shown below.

[Airtightness]

The airtightness of the conductive via part was evaluated by a helium leak detector ("UL200" manufactured by LEYBOLD). For details, a substrate for measurement was set to a jig, and evacuation was performed until the inlet pressure of the measuring device was decreased to 5 Pa. At the time when the inlet pressure reached 5 Pa, He pressurization (0.1 MPa) was performed for 30 seconds. Thereafter, the leakage amount was measured, and evaluated by the following criteria.

A: The leakage amount is less than $1\times10^{-11}$ Pa·m³/sec.
B: The leakage amount is from $1\times10^{-11}$ to $1\times10^{-9}$ Pa·m³/sec.
C: The leakage amount exceeds $1\times10^{-9}$ Pa·m³/sec.

[Presence or Absence of Continuous Dense Layer]

The bonding state between the conductive via part and the hole part wall surface of the insulating substrate was observed under an optical microscope of 1000 magnifications, and evaluated by the following criteria.

S: A continuous dense metal film thicker than in evaluation "A" is present on a bonding surface with the wall surface.
A: A continuous dense metal film is present on a bonding surface with the wall surface.
B: A substantially continuous metal film is present, but a part thereof is cut, or voids are present.
C: No continuous dense film is present.

[Thickness of Metal Film]

An average thickness of 5 points was measured with an X-ray fluorescence film thickness meter.

[Adhesion Between Filled Conductor and Insulating Substrate]

It is difficult to directly measure the adhesion force between the filled conductor in the inside of the via and the hole part wall surface. Therefore, the adhesion force was evaluated by the following method. That is, the adhesion between the filled conductor and the insulating substrate was evaluated by using as a measurement site where a metal film also concurrently formed on a surface of the insulating substrate in the course of forming the metal film on the hole part wall surface of the insulating substrate. When the insulating substrate with the metal film was annealed, it was subjected to adhesion force evaluation after annealing treatment.

Specifically, the conductor paste was screen-printed on the metal film formed on the surface of the insulating substrate to form a conductor pattern of 2 mm×2 mm×0.03 mm t (thickness). Then, firing was performed under predetermined conditions, and a stud pin having a tip area of 1 mm² was vertically bonded with solder to the fired film of 2 mm×2 mm produced to form a test piece. The test piece (fired substrate) was fixed, and the stud pin was gripped by a chuck part of a tensile tester and stretched vertically upward at a rising speed of 33 mm/min. A breaking load at the time when the fired film was peeled from the insulating substrate was measured. Then, from the measured value of the breaking load obtained and a broken area of the fired film, an adhesion strength was calculated using the following equation. The measured value was the average of 6 points.

Adhesion strength (MPa)=breaking load (kgf)/broken area (mm²)×9.8 (N/kgf)

[Average Particle Size of Metal Particles]

The average particle size of the Cu particle and the Ag particle was measured with a laser diffraction scattering type particle size distribution measuring device, and the average particle size of the Ag nanoparticle was measured with a transmission type electron microscope (TEM).

[Volume Change Rate of Conductor Paste]

The volume change rate before and after firing of the conductor paste was calculated by measuring a pattern film thicknesses before and after firing with a stylus type film thickness meter. For details, the conductor paste was screen-printed in a pattern shape of 5 mm×5 mm on a surface of a 96% alumina substrate (manufactured by Nikko Co.), using a screen plate of 250 meshes, and an organic solvent in the conductor paste was removed by heating at 120° C. for 20 minutes to obtain a dried film. A film thickness of the dried film was measured with the stylus type film thickness meter ("Dektak6m" manufactured by Veeco Instruments Inc.) to obtain the film thickness before firing. Then, in the case of copper paste, it was sometimes treated using a continuous drying furnace under various temperatures in the air for 60 minutes, and thereafter, fired using a continuous firing furnace in a nitrogen atmosphere under conditions of a peak temperature of 900° C. although it can be fired as it is. A holding time under the peak temperature was 10 minutes. A residence time of the substrate from a charging port to an outlet of the firing furnace was 60 minutes. On the other hand, in the case of silver paste, heat treatment before firing is unnecessary. However, the firing temperature can be changed as needed, because the volume change rate varies depending on the firing temperature. Similarly with the case of firing of the copper paste, the holding time at the predetermined peak temperature was 10 minutes, and the residence time in the firing furnace was 60 minutes. The thickness of the pattern after firing was measured with the stylus type film thickness meter, and the film thickness values before and after firing were compared by the following equation to determine the volume change rate (%). When the value of the volume change rate (%) is minus, it is shown that the volume is decreased (contracted), and conversely, when the value of the volume change rate is plus, it is shown that the volume is increased.

Volume change rate (%)=[(film thickness after firing−film thickness before firing)/film thickness before firing]×100

[Preparation Method of Cu Paste]

(Raw Materials)

Cu particle having a central particle size (D50) of 7 μm; manufactured by Mitsui Mining & Smelting Co., Ltd.

Cu particle having a central particle size (D50) of 0.8 μm; manufactured by Mitsui Mining & Smelting Co., Ltd.

Glass particle A: a zinc borosilicate-based glass powder having an average particle size of 3 μm, softening point; 565° C.

Organic vehicle A: a mixture obtained by mixing an acrylic resin as an organic binder and a mixed solvent of carbitol and terpineol (mass ratio; 1:1) as an organic solvent in an organic binder/organic solvent mass ratio of ½

(Preparation Examples of Cu paste)

The respective components were blended in each composition shown in Table 1, mixed by a mixer, and thereafter, uniformly kneaded by a triple roll mill, thereby preparing a conductor paste (Cu paste). The volume change rate before and after firing at 900° C. was measured. Further, the volume change rates at the time when heat treated at various temperatures before firing were also measured. The results thereof are shown in Table 1.

TABLE 1

| Paste No. | Composition (parts by mass) | | | | Organic component volume rate (%) | Heat treatment temperature (° C.) | Firing temperature (° C.) | Volume change rate (%) |
|---|---|---|---|---|---|---|---|---|
| | Cu particle (7 μm) | Cu particle (0.8 μm) | Glass particle A | Organic vehicle A | | | | |
| Cu paste 1 | 75 | 25 | 0 | 6.2 | 35.7 | — | 900 | 5.3 |
| | | | | | | 200 | 900 | 9.9 |
| | | | | | | 220 | 900 | 14.8 |
| | | | | | | 230 | 900 | 18.9 |
| | | | | | | 240 | 900 | 23.1 |
| Cu paste 2 | 75 | 25 | 4 | 7.5 | 37.8 | 220 | 900 | 4.5 |
| | | | | | | 240 | 900 | 9.8 |
| Cu paste 3 | 75 | 25 | 0 | 6.8 | 37.8 | — | 900 | −4.6 |
| | | | | | | 220 | 900 | 5.6 |
| | | | | | | 240 | 900 | 10.2 |
| Cu paste 4 | 50 | 50 | 0 | 9.5 | 45.9 | — | 900 | −14.4 |
| | | | | | | | 220 | 900 | −9.5 |

Of the Cu pastes prepared, Cu past 1 heat treated at 240° C. was large in the volume change rate in the plus direction, and Cu paste 4 (paste not heat treated before firing) was large in the volume change rate in the minus direction.

[Preparation Method of Ag Paste]

(Raw Materials)

Ag particle having a central particle size (D50) of 2.5 μm; manufactured by Mitsui Mining & Smelting Co., Ltd.

Ag particle having a central particle size (D50) of 0.25 μm; manufactured by Mitsui Mining & Smelting Co., Ltd.

Glass particle B: bismuth-based glass (Bi₂O₃—ZnO—B₂O₃), bismuth content; 81% by mass in terms of bismuth oxide, softening point; 460° C.

Organic vehicle B: a carbitol solution containing 10% by weight of an ethyl cellulose resin Organic vehicle C: pentanediol Ag nanoparticle having a central particle size (D50) of 30 nm were prepared by the following method.

Into 1000 g of ion exchange water were introduced 66.8 g of silver nitrate, 10 g of acetic acid (manufactured by Wako Pure Chemical Industries, Ltd.) and 2 g of a polymer dispersing agent ("Disperbyk 190" manufactured by BYK, an amphipathic dispersing agent having a polyethylene oxide chain as a hydrophilic unit and an alkyl group as a hydrophobic unit, solvent: water, nonvolatile component: 40% by mass, acid value: 10 mg KOH/g, amine value: 0), followed by vigorous stirring. Then, 100 g of 2-dimethylaminoethanol (manufactured by Wako Pure Chemical Industries. Ltd.) was added thereto, followed by heating and stirring at 70° C. for 2 hours. The reaction product was centrifuged at 7000 rpm for 1 hour using a centrifugal separator ("H-200 SERIES" manufactured by KOKUSAN Co., Ltd.) to recover a precipitate obtained by coagulation of silver nanoparticles protected by a protective colloid. According to measurement with the transmission type electron microscope (TEM), the central particle size of the silver nanoparticle obtained was 30 nm.

In addition, when the content of the protective colloid was measured with a thermogravimetric device (TG/DTA, "EXSTAR 6000" manufactured by Seiko Instruments, Inc.), the content rate thereof was 3 parts by mass based on 100 parts by mass of silver. The measurement with the TG/DTA was performed under conditions of raising the temperature from 30° C. to 550° C. at a rate of 10° C./min, and the content of the protective colloid was calculated from a mass reduction at this time.

(Preparation Examples of Ag Paste)

The respective components were blended in each composition shown in Table 2, mixed by a mixer, and thereafter, uniformly kneaded by a triple roll mill, thereby preparing a conductor paste (Ag paste). The volume change rate before and after firing at the temperature shown in Table 2 was measured. The results thereof are shown in Table 2.

tions of a voltage 200 W, argon gas 0.5 Pa and heating of the substrate 200° C. The metal material species and the average film thickness of the films formed are shown in Tables 3 to 6. When plural species of the metal materials were used, the sputtering operation was performed in order. The metal species of Example 16 is an alloy of Ti and W.

(Annealing Treatment)

When annealing treatment was performed, after the metal film was formed by the sputtering, the alumina substrate was placed in a continuous firing furnace under a nitrogen atmosphere, and the annealing treatment was performed under conditions of holding it at a peak temperature of 900° C. for 10 minutes (the in-out time of the substrate in the firing furnace was 60 minutes).

(Via Filling with Metal Paste)

The through hole substrate was set on a suction table of a screen printing machine (manufactured by Micro-tec Co., Ltd.), and in order to prevent a metal paste (Cu paste or Ag paste) from flowing out, medicine packaging paper was set under the substrate. The metal paste was directly placed on the substrate, and print filling was performed.

(Drying)

The substrate after filling was dried with an air supply drier at 120° C. for 20 minutes.

(Heat Treatment Before Firing)

In the Cu paste, heat treatment was performed with a continuous drying furnace at the temperatures shown in the columns of "heat treatment temperature" in Tables 3 to 5 in the air for 1 hour to adjust the sintering volume change rate during firing.

TABLE 2

| | Composition (parts by mass) | | | | | | Organic component volume rate (%) | Firing temperature (° C.) | Volume change rate (%) |
|---|---|---|---|---|---|---|---|---|---|
| Paste No. | Ag particle (2.5 μm) | Ag particle (0.25 μm) | Ag nano-particle | Glass particle B | Organic vehicle B | Organic vehicle C | | | |
| Ag paste 1 | 50 | 20 | 30 | 0 | 0 | 5.1 | 34.9% | 600 | 1.2 |
| | | | | | | | | 850 | 6.8 |
| Ag paste 2 | 50 | 20 | 30 | 0.5 | 0 | 5.1 | 34.7% | 600 | 3.1 |
| | | | | | | | | 850 | 8.6 |
| Ag paste 3 | 62.5 | 25 | 12.5 | 0 | 2 | 3.6 | 37.0% | 600 | −4.3 |
| | | | | | | | | 850 | 2.5 |
| Ag paste 4 | 75 | 25 | 0 | 0 | 3 | 3 | 38.6% | 600 | −8.7 |
| | | | | | | | | 850 | −13.6 |
| Ag paste 5 | 75 | 25 | 0 | 0 | 3 | 4 | 42.3% | 600 | −16.8 |

Of the Ag pastes prepared, Ag paste 4 fired at 850° C. and Ag paste 5 fired at 600° C. were −10% or less in the volume change rate, and were largely contracted.

Examples 1 to 37 and Comparative Examples 1 to 16

(Preparation of Substrate)

A 96% alumina substrate (manufactured by Nikko Co., Ltd.) having a size of 50 mm×50 mm×0.5 mm t was prepared. Many through holes (vias) having a hole diameter φ of 0.2 mm were formed in the alumina substrate by laser.

(Formation of Metal Film on Hole Part Wall Surface)

A metal material such as an active metal was sputtered on a surface of the alumina substrate and inside wall surfaces of the through holes using a sputtering apparatus ("E-200S" manufactured by Canon Anelva Corporation) under condi- (Firing)

Firing was performed under conditions of an in-out time of 60 minutes, each of the peak temperatures shown in Tables 3 to 6 and a holding time of 10 minutes, in a nitrogen atmosphere in the case of the Cu paste, and in the atmosphere in the case of Ag paste. In the case of the Ag paste, the firing volume change rate of the conductor paste was adjusted by adjustment of the firing temperature.

(Lap Polishing)

For the substrate after firing, both surfaces thereof were each polished by 0.1 mm by lap polishing, and thereafter, the surface roughness Ra was adjusted to 0.05 μm or less by mirror polishing.

The evaluation results of the via-filled substrates obtained are shown in Tables 3 to 6.

TABLE 3

| Example No. | Active Metal Layer | | Barrier Layer | | Bonding Layer | | Annealing Treatment |
|---|---|---|---|---|---|---|---|
| | Metal Species | Film thickness (μm) | Metal Species | Film Thickness (μm) | Metal Species | Film Thickness (μm) | Temperature (° C.) |
| 1 | Ti | 0.1 | Pd | 0.15 | — | — | — |
| 2 | Ti | 0.1 | Pd | 0.15 | — | — | 900 |
| 3 | Cr | 0.1 | Pd | 0.15 | — | — | — |
| 4 | Zr | 0.1 | Pd | 0.15 | — | — | — |
| 5 | Ti | 0.1 | Pd | 0.15 | Cu | 0.1 | — |
| 6 | Ti | 0.1 | Pd | 0.15 | Cu | 0.1 | 900 |
| 7 | Ti | 0.1 | Pt | 0.15 | — | — | — |
| 8 | Ti | 0.05 | Pd | 0.15 | — | — | — |
| 9 | Ti | 0.01 | Pd | 0.15 | — | — | — |
| 10 | Ti | 0.01 | Pd | 0.15 | — | — | 900 |
| 11 | Ti | 0.2 | Pd | 0.15 | — | — | — |
| 12 | Ti | 0.1 | — | — | — | — | — |
| 13 | Ti | 0.1 | — | — | — | — | 900 |
| 14 | Ti | 0.1 | — | — | Cu | 0.1 | — |
| 15 | Ti | 0.1 | — | — | Cu | 0.1 | 900 |
| 16 | Ti/W | 0.1 | — | — | Cu | 0.1 | — |
| 17 | Ti | 0.1 | Pd | 0.15 | — | — | — |

| Example No. | Paste Species | Heat Treatment Temperature (° C.) | Firing Temperature (° C.) | Volume Change Rate (%) | Airtightness | Presence or Absence of Continuous Dense Layer | Adhesion Force (MPa) | Comprehensive Evaluation |
|---|---|---|---|---|---|---|---|---|
| 1 | Cu paste 1 | — | 900 | 5.3 | A | A | 46 | A |
| 2 | Cu paste 1 | — | 900 | 5.3 | A | S | 53 | S |
| 3 | Cu paste 1 | — | 900 | 5.3 | A | A | 44 | A |
| 4 | Cu paste 1 | — | 900 | 5.3 | A | A | 46 | A |
| 5 | Cu paste 1 | — | 900 | 5.3 | A | A | 51 | A |
| 6 | Cu paste 1 | — | 900 | 5.3 | A | S | 65 | S |
| 7 | Cu paste 1 | — | 900 | 5.3 | A | A | 46 | A |
| 8 | Cu paste 1 | — | 900 | 5.3 | A | A | 42 | A |
| 9 | Cu paste 1 | — | 900 | 5.3 | B | B | 29 | B |
| 10 | Cu paste 1 | — | 900 | 5.3 | B | A | 36 | B |
| 11 | Cu paste 1 | — | 900 | 5.3 | A | A | 46 | A |
| 12 | Cu paste 1 | — | 900 | 5.3 | B | C | 32 | B |
| 13 | Cu paste 1 | — | 900 | 5.3 | B | C | 34 | B |
| 14 | Cu paste 1 | — | 900 | 5.3 | B | B | 38 | B |
| 15 | Cu paste 1 | — | 900 | 5.3 | A | B | 44 | A |
| 16 | Cu paste 1 | — | 900 | 5.3 | A | A | 46 | A |
| 17 | Cu paste 2 | 220 | 900 | 4.5 | A | A | 48 | A |

TABLE 4

| Comparative Example No. | Active Metal Layer | | Barrier Layer | | Bonding Layer | | Annealing Treatment |
|---|---|---|---|---|---|---|---|
| | Metal Species | Film thickness (μm) | Metal Species | Film Thickness (μm) | Metal Species | Film Thickness (μm) | Temperature (° C.) |
| 1 | — | — | — | — | — | — | — |
| 2 | — | — | — | — | — | — | — |
| 3 | — | — | — | — | — | — | — |
| 4 | — | — | — | — | Cu | 0.1 | — |
| 5 | — | — | Pd | 0.15 | — | — | — |
| 6 | — | — | Pd | 0.15 | Cu | 0.1 | — |
| 7 | — | — | Pd | 0.15 | Cu | 0.1 | 900 |

| Comparative Example No. | Paste Species | Heat Treatment Temperature (° C.) | Firing Temperature (° C.) | Volume Change Rate (%) | Airtightness | Presence or Absence of Continuous Dense Layer | Adhesion Force (MPa) | Comprehensive Evaluation |
|---|---|---|---|---|---|---|---|---|
| 1 | Cu paste 1 | — | 900 | 5.3 | C | C | 6 | C |
| 2 | Cu paste 1 | 220 | 900 | 14.8 | C | C | 8 | C |
| 3 | Cu paste 2 | 220 | 900 | 4.5 | C | C | 38 | C |
| 4 | Cu paste 2 | 220 | 900 | 4.5 | C | C | 30 | C |
| 5 | Cu paste 2 | 220 | 900 | 4.5 | C | B | 15 | C |
| 6 | Cu paste 2 | 220 | 900 | 4.5 | C | B | 13 | C |
| 7 | Cu paste 2 | 220 | 900 | 4.5 | C | B | 15 | C |

TABLE 5

| | No. | Active Metal Layer Metal Species | Active Metal Layer Film thickness (μm) | Barrier Layer Metal Species | Barrier Layer Film Thickness (μm) | Bonding Layer Metal Species | Bonding Layer Film Thickness (μm) | Annealing Treatment Temperature (°C) |
|---|---|---|---|---|---|---|---|---|
| Example | 18 | Ti | 0.1 | Pd | 0.15 | — | — | — |
| | 19 | Ti | 0.1 | Pd | 0.15 | — | — | — |
| | 20 | Ti | 0.1 | Pd | 0.15 | — | — | — |
| | 21 | Ti | 0.1 | Pd | 0.15 | — | — | — |
| | 22 | Ti | 0.1 | Pd | 0.15 | — | — | — |
| | 23 | Ti | 0.1 | Pd | 0.15 | — | — | — |
| | 24 | Ti | 0.1 | Pd | 0.15 | — | — | 900 |
| Comparative Example | 8 | Ti | 0.1 | Pd | 0.15 | — | — | — |
| | 9 | Ti | 0.1 | Pd | 0.15 | — | — | 900 |
| | 10 | Ti | 0.1 | Pd | 0.15 | — | — | — |

| | No. | Paste Species | Heat Treatment Temperature (°C) | Firing Temperature (°C) | Volume Change Rate (%) | Airtightness | Presence or Absence of Continuous Dense Layer | Adhesion Force (MPa) | Comprehensive Evaluation |
|---|---|---|---|---|---|---|---|---|---|
| Example | 18 | Cu paste 3 | — | 900 | -4.6 | A | A | 44 | A |
| | 19 | Cu paste 3 | 220 | 900 | 5.6 | A | A | 46 | A |
| | 20 | Cu paste 3 | 240 | 900 | 10.2 | A | A | 48 | A |
| | 21 | Cu paste 1 | 220 | 900 | 14.8 | A | A | 44 | A |
| | 22 | Cu paste 1 | 230 | 900 | 18.9 | B | A | 46 | B |
| | 23 | Cu paste 4 | 220 | 900 | -9.5 | B | A | 46 | B |
| | 24 | Cu paste 4 | 220 | 900 | -9.5 | B | S | 53 | B |
| Comparative Example | 8 | Cu paste 1 | 240 | 900 | 23.1 | C | B | 44 | C |
| | 9 | Cu paste 1 | 240 | 900 | 23.1 | C | A | 53 | C |
| | 10 | Cu paste 4 | — | 900 | -14.4 | C | B | 48 | C |

TABLE 6

| | No. | Active Metal Layer Metal Species | Active Metal Layer Film thickness (μm) | Barrier Layer Metal Species | Barrier Layer Film Thickness (μm) | Bonding Layer Metal Species | Bonding Layer Film Thickness (μm) | Annealing Treatment Temperature (°C) |
|---|---|---|---|---|---|---|---|---|
| Example | 25 | Ti | 0.1 | Pd | 0.15 | — | — | — |
| | 26 | Cr | 0.1 | Pd | 0.15 | — | — | — |
| | 27 | Zr | 0.1 | Pd | 0.15 | — | — | — |
| | 28 | Ti | 0.1 | Pd | 0.15 | Ag | 0.1 | — |
| | 29 | Ti | 0.1 | Pd | 0.15 | Ag | 0.1 | 900 |
| | 30 | Ti | 0.1 | — | — | Ag | 0.1 | — |
| | 31 | Ti | 0.1 | — | — | — | — | — |
| | 32 | Ti | 0.1 | Pd | 0.15 | — | — | — |
| | 33 | Ti | 0.1 | Pd | 0.15 | — | — | — |
| | 34 | Ti | 0.1 | Pd | 0.15 | — | — | — |
| | 35 | Ti | 0.1 | Pd | 0.15 | — | — | — |
| | 36 | Ti | 0.1 | Pd | 0.15 | — | — | — |
| | 37 | Ti | 0.1 | Pd | 0.15 | — | — | 900 |
| Comparative Example | 11 | Ti | 0.1 | Pd | 0.15 | — | — | — |
| | 12 | Ti | 0.1 | Pd | 0.15 | — | — | — |
| | 13 | — | — | — | — | — | — | — |
| | 14 | — | — | — | — | Ag | 0.1 | — |
| | 15 | — | — | Pd | 0.15 | — | — | — |
| | 16 | — | — | Pd | 0.15 | Ag | 0.1 | 900 |

| | No. | Paste Species | Firing Temperature (°C) | Volume Change Rate (%) | Airtightness | Presence or Absence of Continuous Dense Layer | Comprehensive Evaluation |
|---|---|---|---|---|---|---|---|
| Example | 25 | Ag paste 1 | 600 | 1.2 | A | A | A |
| | 26 | Ag paste 1 | 600 | 1.2 | A | A | A |
| | 27 | Ag paste 1 | 600 | 1.2 | A | A | A |
| | 28 | Ag paste 1 | 600 | 1.2 | A | A | A |
| | 29 | Ag paste 1 | 600 | 1.2 | A | S | A |
| | 30 | Ag paste 1 | 600 | 1.2 | A | B | A |
| | 31 | Ag paste 1 | 600 | 1.2 | B | C | B |
| | 32 | Ag paste 2 | 600 | 3.1 | A | A | A |
| | 33 | Ag paste 1 | 850 | 6.8 | A | A | A |
| | 34 | Ag paste 2 | 850 | 8.6 | A | A | A |

TABLE 6-continued

|  |  | | | | | | | |
|---|---|---|---|---|---|---|---|---|
| | 35 | Ag paste 3 | 600 | −4.3 | A | A | A |
| | 36 | Ag paste 4 | 600 | −8.7 | B | A | B |
| | 37 | Ag paste 4 | 600 | −8.7 | A | S | A |
| Comparative | 11 | Ag paste 4 | 850 | −13.6 | C | B | C |
| Example | 12 | Ag paste 5 | 600 | −16.8 | C | C | C |
| | 13 | Ag paste 2 | 600 | 3.1 | C | C | C |
| | 14 | Ag paste 2 | 600 | 3.1 | C | C | C |
| | 15 | Ag paste 2 | 600 | 3.1 | C | C | C |
| | 16 | Ag paste 2 | 600 | 3.1 | C | B | C |

As is apparent from the results of Table 3, when the conductive via parts were formed in the metal film containing the active metal layer using the Cu paste having a volume change rate before and after firing of −10 to 20% the dense conductive via parts having no voids or no gaps and having good airtightness were formed. In particular, as is apparent from the comparison results between Examples 1 and 2, 5 and 6, and 9 and 10, respectively, bonding to the hole wall surface became dense by performing the annealing treatment before firing to further improve the adhesion force. In addition, in Examples 5 and 6 in which the Cu film was further formed as the bonding layer on the barrier layer, the better adhesion force was obtained. On the other hand, in Examples 12 to 15 in which no barrier layer was provided, the adhesion force was low.

As is apparent from the results of Table 4, in the via-filled substrate having no active metal layer, voids or gaps occurred to cause low airtightness. In addition, the adhesion force between the filled conductor and the substrate was also low, except for Comparative Example 3. In Comparative Example 3, the glass component blended in the paste directly came to contact with the substrate wall surface to exhibit the adhesion by a binder effect of the glass component. Because there was no metal layer stably adhered to the substrate wall surface in the hole in these Comparative Examples, when the conductor paste was fired, wettability of the filled metal to the substrate wall surface was deteriorated to cause easy occurrence of voids or gaps between the filled metal and the wall surface, thereby reducing the airtightness. In Comparative Examples 5 to 7, the Pd film was formed on the wall surface. However, Pd is not an active metal and does not react with the ceramic substrate. It is therefore easily peeled from the substrate wall surface by alloying with the filled conductor during firing, and an effect of improving the wettability cannot be expected.

As is apparent from the results of Table 5, when the sintering volume change rate of the conductor paste was within the range of −10 to 20%, the good results were obtained. However, in Comparative Examples 8 to 10 in which the Cu paste having an excessively large sintering volume change rate in the minus direction or in the plus direction was used, voids or gaps occurred, and the good airtightness was not obtained, although the adhesion force was not low.

As is apparent from the results of Table 6, in Examples 25 to 37 in which the conductive via parts were formed in the metal film containing the active metal layer using the Ag paste having a volume change rate before and after firing of −10 to 20%, the dense conductive via parts having no voids or no gaps were formed, and the good airtightness was obtained. On the other hand, in Comparative Examples 11 and 12 in which the Ag paste having an excessively large volume change rate in the minus direction was used, voids or gaps occurred, and the airtightness was low. Further, also in Comparative Examples 13 to 16 in which no active metal layer was provided, voids or gaps occurred, and the airtightness was low.

Examples 38 and 39

Via-filled substrates were produced and evaluated in the same manner as in Examples 1 and 25 except for using an aluminum nitrate substrate (manufactured by MARUWA Co., Ltd., thermal conductivity: 170 W/m·K) in place of the 96% aluminum substrate. As a result, the same evaluations as in Examples 1 and 25 were obtained.

While the present invention has been described in detail with reference to specific embodiments, it will be apparent to those skilled in the art that various modifications and changes can be made without departing from the spirit and scope of the invention.

This application is based on Japanese Patent Application No. 2015-187367 filed on Sep. 24, 2015, the contents of which are incorporated herein by reference.

INDUSTRIAL APPLICABILITY

The via-filled substrate of the present invention can be used for a circuit substrate, an electronic component, a substrate of a semiconductor package, and the like.

The invention claimed is:

1. A method for producing a via-filled substrate comprising: a metal film forming step of forming a metal film containing an active metal on a hole part wall surface of an insulating substrate having a hole part; a filling step of filling a conductor paste having a volume change rate before and after firing of −10 to 20% and containing no glass component or inorganic binder in the hole part in which the metal film is formed; and a firing step of firing the insulating substrate in which the conductor paste is filled, wherein in the metal film forming step, an active metal layer containing at least one active metal selected from the group consisting of Ti, Zr, Nb, Ta, Cr, Mn and Al or an alloy containing the at least one active metal is formed on the hole part wall surface.

2. The production method according to claim 1, wherein in the metal film forming step, a non-permeable layer containing at least one metal selected from the group consisting of Mo, W, Ni, Pd and Pt or an alloy containing the at least one metal is further formed on the active metal layer.

3. The production method according to claim 1, wherein in the metal film forming step, a bonding layer containing a metal that is the same as or capable of being alloyed with a metal contained in the conductor paste is formed on an uppermost surface in contact with the conductor paste.

4. The production method according to claim 1, wherein in the metal film forming step, the metal film is formed by a physical vapor deposition method.

5. The production method according to claim 1, further comprising an annealing step of heating the metal film in an inert gas atmosphere at a temperature of 400° C. or more and equal to or less than a melting point of a metal having the lowest melting point among all metal species constituting the metal film or a melting point of an alloy constituting the metal film, whichever is lower, as a preceding step of the filling step.

6. The production method according to claim 1, wherein the conductor paste contains a metal particle and an organic vehicle, the metal particle contains a small metal particle having a particle size of less than 1 μm and a large metal particle having a particle size of 1 to 50 μm, and a ratio of the organic vehicle is 40% by volume or less based on a whole paste.

7. The production method according to claim 6, wherein the metal particle is at least one metal selected from the group consisting of Cu, Ag, Ni, Au, Pt and Al or an alloy containing the at least one metal.

8. The production method according to claim 6, wherein the small metal particle contains a metal nanoparticle having a particle size of 100 nm or less.

9. The production method according to claim 1, wherein the insulating substrate is a ceramic substrate, a glass substrate, a silicon substrate or an enamel substrate.

10. A via-filled substrate precursor comprising an insulating substrate having a hole part, a metal film containing an active metal formed on a hole part wall surface, and a conductor paste filled in the hole part in which the metal film is formed and having a volume change rate before and after firing of −10 to 20% and containing no glass component or inorganic binder, wherein the metal film comprises an active metal layer containing at least one active metal selected from the group consisting of Ti, Zr, Nb, Ta, Cr, Mn and Al or an alloy containing the at least one active metal on the hole part wall surface.

* * * * *